United States Patent
Yanase

(10) Patent No.: US 10,053,367 B2
(45) Date of Patent: Aug. 21, 2018

(54) METHOD OF MANUFACTURING GRAPHENE FILM AND METHOD OF MANUFACTURING PELLICLE USING THE SAME

(71) Applicant: SHIN-ETSU CHEMICAL CO., LTD., Chiyoda-ku (JP)

(72) Inventor: Yu Yanase, Annaka (JP)

(73) Assignee: SHIN-ETSU CHEMICAL CO., LTD., Chiyoda-ku (JP)

(*) Notice: Subject to any disclaimer, the term of this patent is extended or adjusted under 35 U.S.C. 154(b) by 0 days.

(21) Appl. No.: 15/808,143

(22) Filed: Nov. 9, 2017

(65) Prior Publication Data

US 2018/0134561 A1    May 17, 2018

(30) Foreign Application Priority Data

Nov. 11, 2016  (JP) ................... 2016-220221

(51) Int. Cl.

| | |
|---|---|
| *B44C 1/22* | (2006.01) |
| *C03C 15/00* | (2006.01) |
| *C03C 25/68* | (2006.01) |
| *C23F 1/00* | (2006.01) |
| *C01B 32/184* | (2017.01) |
| *B05D 1/00* | (2006.01) |
| *B05D 3/02* | (2006.01) |
| *B05D 3/10* | (2006.01) |
| *B82Y 40/00* | (2011.01) |
| *B82Y 30/00* | (2011.01) |

(52) U.S. Cl.
CPC ............ *C01B 32/184* (2017.08); *B05D 1/005* (2013.01); *B05D 3/0254* (2013.01); *B05D 3/107* (2013.01); *B82Y 30/00* (2013.01); *B82Y 40/00* (2013.01); *Y10S 977/734* (2013.01); *Y10S 977/888* (2013.01); *Y10S 977/892* (2013.01)

(58) Field of Classification Search
USPC .......................................... 216/95
See application file for complete search history.

(56) References Cited

U.S. PATENT DOCUMENTS

| | | |
|---|---|---|
| 2015/0309404 A1 | 10/2015 | Lin et al. |
| 2016/0139500 A1 | 5/2016 | Kim et al. |
| 2016/0201201 A1 | 7/2016 | Kim et al. |

FOREIGN PATENT DOCUMENTS

| | | |
|---|---|---|
| JP | 2013-534727 A | 9/2013 |
| JP | 2015-018228 A | 1/2015 |
| WO | WO 2013/096841 A1 | 6/2013 |

OTHER PUBLICATIONS

Extended European Search Report dated Mar. 27, 2018 in Patent Application No. 17198221.8, 6 pages.

(Continued)

*Primary Examiner* — Robert Culbert
(74) *Attorney, Agent, or Firm* — Oblon, McClelland, Maier & Neustadt, L.L.P.

(57) ABSTRACT

There is provided a method for preparing a graphene film for pellicle, and also a method for making a pellicle using such graphene film: wherein a film-like graphene deposited on a base material is coated with a protective film, from which the base material is chemically removed by an etching liquid and then the protective film is chemically removed by a solvent whose surface tension is lower than that of the etching liquid; the pellicle frame may be attached to the film-like graphene before the protective film is completely removed or thereafter.

3 Claims, 2 Drawing Sheets

(56) References Cited

OTHER PUBLICATIONS

Ki Chang Kwon, et al., "Fluoropolymer-Assisted Graphene Electrode for Organic Light-Emitting Diodes" Organic Electronics, vol. 15, No. 11, XP 029076514, Nov. 30, 2014, pp. 3154-3161.

METHOD OF MANUFACTURING GRAPHENE FILM AND METHOD OF MANUFACTURING PELLICLE USING THE SAME

The present non-provisional patent application claims priority, as per Paris Convention, from Japanese Patent Application No. 2016-220221 filed on 2016 Nov. 11, the disclosure of which is hereby incorporated by reference herein in its entirety.

FIELD OF THE INVENTION

The present invention relates to a method of manufacturing a graphene film and to a method of manufacturing a pellicle using the same as a pellicle film.

BACKGROUND OF TECHNOLOGY

In the photolithography technology used in the semiconductor manufacturing process, shortening of the wavelength of the exposure light source has been progressed as means for increasing the resolution. To date, the exposure light source has shifted from g-line (436 nm) and i-line (365 nm) by mercury lamp to KrF excimer laser (248 nm) and ArF excimer laser (193 nm), and furthermore, the use of EUV (Extreme Ultra Violet) light with a dominant wavelength of 13.5 nm is also being studied.

In a photolithography step of a semiconductor or a liquid crystal display manufacturing process, a pattern is formed by irradiating light to a semiconductor wafer or an original plate for liquid crystal coated with resist; if, however, a foreign matter is adhered to the lithography mask or the reticle used on this occasion (hereinafter collectively referred to as "exposure original plate"), this foreign matter absorbs light or bends light, whereby the transferred pattern becomes deformed or the edges become coarse, and the base becomes dirty black with the resulting problems of impaired size, quality, appearance and the like.

Though these processes are usually performed in a clean room, it is still difficult to keep the exposure original plate clean at all times. Therefore, in general, a means called pellicle for fending off foreign matters is installed on the exposure original plate before the exposure is conducted.

This pellicle is generally composed of a rectangular pellicle frame, a pellicle film attached in a slack-free manner to an upper end face of the pellicle frame, an airtight gasket formed on a lower end face of the pellicle frame, as well as other minor parts, and the said pellicle film exhibits a high transmittance with respect to exposure light. As the said airtight gasket, an adhesive or the like is used.

If such a pellicle is installed on the exposure original plate, the foreign matters do not directly adhere to the exposure original plate for they are intercepted by the pellicle. Then, in the photolithography step, if the focal point is aligned with the pattern of the exposure original plate, the foreign matters on the pellicle are off the focal point and hence their images are not transferred, and thus the problems such as deformation of the pattern can be solved.

Incidentally, the material for the pellicle film is to have a high transmittance and selected in accordance with the type of exposure light. For example, when exposure light is g-line (436 nm), i-line (365 nm), KrF excimer laser (248 nm), or ArF excimer laser (193 nm), then nitrocellulose, cellulose acetate, fluorine-based polymer and the like are used as the pellicle film.

On the other hand, in the newly developed EUV exposure, the transmittance of the conventional pellicle films are so low that they are difficult to perform the role. Therefore, as a pellicle film to be used for EUV exposure, ultrathin silicon or graphene, which show high transmittance for EUV light, are being studied.

PRIOR ART PUBLICATIONS

IP Publications

[IP Publication 1] JP International Publication (Tokuhyou) No. 2013-534727
[IP Publication 2] JP Unexamined Patent Application Publication No. 2015-18228

SUMMARY OF THE INVENTION

Problems the Invention Seeks to Solve

IP Publication 1 describes that graphene is used as a pellicle film. Therein, a graphene sheet, a graphene flake, a laminate film consisting of a graphene sheet and a support material, and the like are used as the pellicle film, but IP Publication 1 does not describe how these articles are produced.

Then, IP Publication 2 discloses a pellicle film made of a composite film, in which a graphene film and a supporting mesh film are joined; and a manufacturing method thereof is also described. Specifically, a graphene film is formed on a catalytic metal substrate (base material), and a resin is brought into close contact as a protective film on that surface of the graphene film which is not in contact with the substrate. Thereafter, the catalyst metal is dissolved and removed, the graphene film is transferred and bonded to a surface of a supporting mesh film, and finally the protective resin film is dissolved and removed with a solvent.

When a support material or a support mesh film is used for the pellicle film as in the method described in IP Publication 2, although the mechanical strength is improved, the transmittance of the exposure light is limited; so ideally, it is desirable to use a single graphene film as the pellicle film.

Graphene can be formed on a base material such as a Ni foil or a Cu foil by CVD (Chemical Vapor Deposition) method. Further, by applying a thermal release sheet to thus formed graphene, etching the base material, and applying the graphene to another base material, and then removing the thermal release sheet, it is possible to transfer the graphene to a desired base material such as $SiO_2/Si$.

In order to use such graphene as a pellicle film, it is necessary to remove a base material to obtain an isolated graphene film. However, as a result of attempts by the inventor of the present invention, it was found that when a graphene film provided on a base material is put in a wet etching liquid to be rid of the base material, the graphene film is hard to lift alone from the liquid after the wet etching, for the graphene film is broken.

The present inventor further studied and found that the breakage of the graphene film is caused by the surface tension of the wet etching liquid as well as the chemical attack the graphene incurs from the acid or alkali etching liquid.

Accordingly, it is an object of the present invention to provide an effective production method for obtaining a graphene film and it is also another object to provide a method for producing a pellicle exhibiting high transmittance to EUV light.

Means for Solving the Problem

Thus, the present invention provides a method for manufacturing an isolated graphene, characterized in that it comprises the steps of: preparing graphene provided on a substrate; coating the graphene with a protective film; removing the substrate by wet etching; and dissolving the protective film using a solvent whose surface tension is lower than that of an etching liquid used in said wet etching.

In the manufacturing method of the present invention, it is preferable that the protective film is of a fluororesin, and that the solvent is a fluorine-based solvent. A pellicle can be produced using the graphene film obtained by this manufacturing method as its pellicle film.

Effect of the Invention

According to the method for producing a graphene film of the present invention, breakage and damage of the graphene film in the manufacturing process can be suppressed. Further, if the graphene film obtained according to the present invention is used as the pellicle film, a pellicle suitable for EUV exposure can be produced.

EMBODIMENTS FOR CARRYING OUT THE INVENTION

Hereinafter, one embodiment of the present invention will be described with reference to the drawings.

Figure 1A:
FIGS. 1A-1K are schematic drawings showing steps (A) through (K) of an embodiment of the method for manufacturing a graphene film of the present invention.

In the present invention, first, graphene 2 is prepared on a substrate 1 as shown in FIG. 1A. A method of providing the graphene 2 on the substrate 1 is not particularly limited, and a known method may be used.

As a preparation method of the graphene 2, for example, mechanical peeling from graphite, a CVD method, a surface thermal decomposition method of a SiC substrate, and the like can be mentioned, but CVD method is preferable from the viewpoint of mass productivity. In this CVD method, graphene 2 is deposited on a base material 1 such as Ni foil, Cu foil or the like using a hydrocarbon gas as a raw material. Further, by attaching a thermal release sheet 3 to the thus prepared graphene 2, etching the base material 1, attaching the thermal release sheet to another base material 5, and then removing the thermal release sheet 3, the graphene can be transferred to the other substrate such as Si/SiO$_2$.

There is no particular limitation on the base material 1 used in this step, and a Ni foil, a Cu foil or a composite substrate made from the Ni foil or the Cu foil and a base material such as SiO$_2$/Si or the like, or even the SiO$_2$/Si after transferring graphene may be used as the base material 1. In addition, although this graphene 2 is preferably made of a single layer from the viewpoint of transmittance, it may have a multilayer structure from the viewpoint of mechanical strength. Preferably, it is either of a single layer structure or a multilayer structure of about 2 to 100 layers.

Figure 1B:
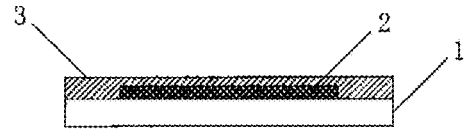

Next, the graphene 2 provided on the substrate 1 is covered up with the protective film 3 as shown in FIG. 1B. Now, the protective film 3 is preferably resistant to a wet etching liquid to be used for removing the base material 1 in a later step. In addition, the surface tension of the solvent which is to dissolve and remove this protective film 3 needs to be lower than the surface tension of the wet etching liquid.

The method of coating the graphene 2 with the protective film 3 may be appropriately selected based on the material used to make the protective film 3. For example, when a resin is used to form the protective film 3, the graphene 2 can be coated with the protective film 3 by applying the solution of the resin in a known manner such as spin coating or dip coating. and then removing the solvent from the solution.

Figure 1C:
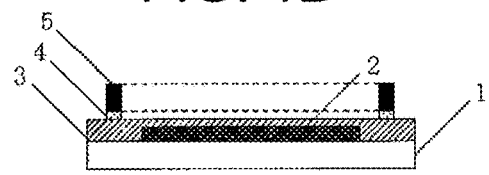
Figure 1D:
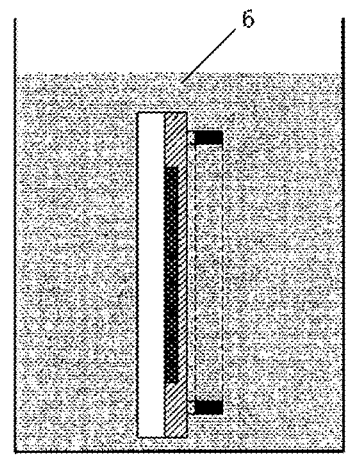
Figure 1F:
Figure 1E:
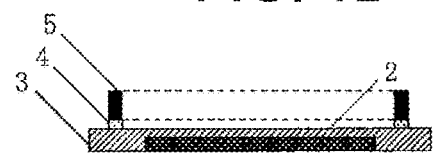

In the present invention, as shown in FIGS. 1D-1E, the graphene 2 provided on the base material 1 is covered with the protective film 3, and then the base material 1 is removed by wet etching. In this wet etching, a liquid that can etch the substrate 1 is used as the wet etching liquid 6, and hence the wet etching liquid 6 may be appropriately selected based on the type of the substrate 1 to be etched. When the base material 1 is made of SiO$_2$/Si, for example, a 24% potassium hydroxide aqueous solution or the like can be used as the wet etching liquid 6. The surface tension of the 24% potassium hydroxide aqueous solution is 72 mN/m.

In this wet etching step, even though the base material 1 is dissolved off, the film-like graphene 2 is yet supported by the protective film 3, so that when the graphene 2 is raised from the wet etching liquid 6, breakage of the graphene 2 can be prevented thanks to the protective film 3. It is also possible that the protective film 3 prevents that surface of the graphene 2 which is opposite to the base material 1 from being damaged by the wet etching liquid 6.

Figure 1G:
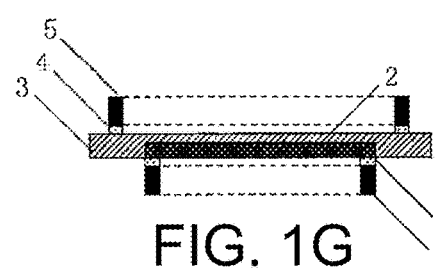
Figure 1H:
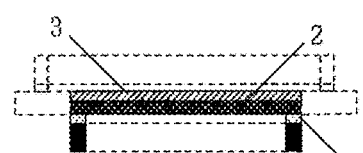
Figure 1I:
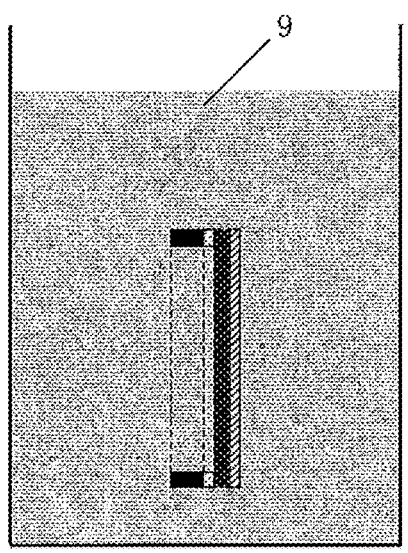
Figure 1J:
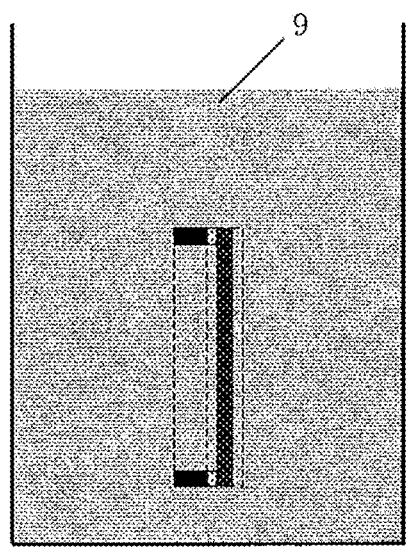

Next, as shown in FIGS. 1I-1J, after the base material 1 is removed by the wet etching liquid 6, a solvent 9 having a lower surface tension than the wet etching liquid 6 is used to dissolve and remove the protective film 3. The solvent 9 is selected based on the type of the protective film 3 and the wet etching liquid 6, and the protective film 3 is also selected based on the type of the solvent 9 available.

For example, an acrylic resin can be selected as the protective film 3 and acetone can be selected as the solvent 9. Or, a fluororesin can be selected as the protective film 3 and a fluorine-based solvent can be selected as the solvent 9. In particular, since the fluororesin has high chemical resistance, it is preferable as the protective film 3, and the fluorine-based solvent is preferable as the solvent 9 used in this step because its surface tension is generally low.

In this step, even though the protective film 3 is dissolved and removed from the graphene 2, the surface tension of the solvent 9 is so small that it is possible to lessen its stress on the film-like graphene 2, wherefore the graphene 2 can be raised from the solvent 9 without breakage or other damages.

By using the film-shaped graphene 2 thus obtained as the pellicle film which is attached to cover up the opening defined by the frame of the pellicle, it is possible to construct a pellicle. This pellicle may be provided with an adhesive for fixing the pellicle on the exposure original plate, a ventilation hole for adjusting the pressure inside the frame, a filter for preventing entry of foreign matter through the ventilation hole, etc.; the material and the shape of such added elements are not limited either. Furthermore, this pellicle is suitable as a pellicle for EUV exposure because it uses a graphene film with high transmittance for EUV light as the pellicle film.

Incidentally, in the method of manufacturing a graphene film of the present invention, it is possible to provide a holding member 5 as shown in FIG. 1C. Here, the graphene 2 covered with the protective film 3 and the holding member 5 are bonded together via an adhesive 4. This holding member 5 can be used for handling, for example, and it can be a metal frame or the like. As for the adhesive 4, it is not particularly limited, and any known adhesive may be used.

Although the timing of providing the holding member 5 is not particularly limited, it is possible, for example, to provide it onto the graphene 2 after the base material 1 is removed by the wet etching, as shown in FIG. 1G wherein the holding member is designated as 8, (such that the base material 1 is replaced by the holding member 8).

In the present invention, a support member such as a support mesh film may be provided on the graphene film. With the support member provided, breakage of the graphene film in the manufacturing process can further be suppressed. In addition, it is also possible to increase the aperture ratio of the support mesh film, so that the transmittance of exposure light can be increased. As described above, the support member can be provided on the graphene 2 after the base material 1 is removed, as well as on the protective film 3.

Further, the holding member may be caused to be the pellicle frame. By doing so, it is possible to obtain straightaway the graphene film and the pellicle frame joined together.

EXAMPLES

Example 1

First, a sample in which a 100-mm square graphene 2 (composed of 30 to 60 layers) was provided on a Si(SiO$_2$/Si) base material 1 having a SiO$_2$ layer on its surface was prepared (FIG. 1A). Next, a fluororesin (Cytop CTX-S manufactured by Asahi Glass Co., Ltd.) as the protective film 3 was applied to the graphene 2 provided on the base material 1 by spin coating in a manner such that its thickness becomes 1 μm after drying, and then it was cured by heating at 180° C. for 1 minute (FIG. 1B). Subsequently, a 150-mm square SUS (stainless steel) frame serving as the holding member 5 was glued, via an epoxy resin-based adhesive 4 (EP330 manufactured by CEMEDINE CO., LTD.), on the fluororesin serving as the protective film 3 in a manner such that the frame 5 surrounds the graphene 2, when seen from above (FIG. 1C).

Next, this entity was immersed in a 24% potassium hydroxide aqueous solution (surface tension: 72 mN/m), whereby the SiO$_2$/Si base material 1 was caused to undergo wet etching. When the SiO$_2$/Si substrate 1 was chemically removed, the graphene 2 supported by the fluororesin protective film 3 was taken out from the etching liquid, and the graphene film 2 was found without breakage (FIGS. 1D-1F).

Subsequently, a 100-mm square SUS frame serving also as the holding member 8 was bonded to the graphene film 2 supported by the fluororesin protective film 3 via an epoxy resin-based adhesive 4 (EP330 manufactured by Cemedine Co., Ltd.) (FIG. 1G). On this occasion, that part of the fluororesin protective film 3 which lies outside of the 100-mm square SUS frame 8 was physically removed together with the holding member 5 and the adhesive 4 (FIG. 1H).

Figure 1K:
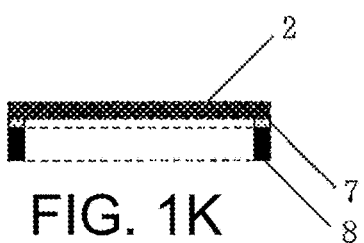

Next, this entity was vertically immersed in fluorine solvent 9 (NOVEC 7300, manufactured by Sumitomo 3M Ltd., surface tension: 15 mN/m) for 24 hours, whereby the fluororesin protective film 3 was completely dissolved and removed; then the remnant entity was pulled up slowly and the thus obtained graphene film 2 was observed and found to have no damage or breakage (FIGS. 1I-1K).

Comparative Example 1

First, a sample in which a 100-mm square graphene 2 (composed of 30 to 60 layers) was provided on a Si(SiO$_2$/Si) base material 1 having a SiO$_2$ layer on its surface was prepared. Next, without applying any protective film 3 to the graphene 2, the latter was directly bonded to a 100-mm square SUS frame using an epoxy resin-based adhesive 4 (EP330 manufactured by Cemedine Co., Ltd.).

Subsequently, this entity was immersed in a 24% potassium hydroxide aqueous solution (surface tension: 72 mN/m), whereby the SiO$_2$/Si base material 1 was caused to undergo wet etching. When the SiO$_2$/Si base material 1 was removed, the appearance of the graphene film 2 was observed and it was found that the graphene film 2 had been eroded by the etching liquid 6 so much that there were even holes.

Further, when the graphene film 2 was taken out from the wet etching liquid 6, the graphene film 2 was broken due to the relatively high surface tension of the etching liquid 6.

EXPLANATION OF REFERENCE NUMERALS

1: base material
2: graphene (graphene film)
3: protective film
4: adhesive
5, 8: holding member
6: wet etching liquid
7: adhesive
9: solvent

What is claimed is:

1. A method for manufacturing a graphene film characterized by including steps of:
   (i) preparing a film-like graphene provided on a base material; (ii) coating said graphene with a protective film; (iii) removing said base material by wet etching with an etching liquid; (iv) and dissolving the protective film using a solvent whose surface tension is lower than that of said wet etching liquid.

2. The method for manufacturing a graphene film as claimed in claim 1 wherein said protective film is a fluororesin, and said solvent is a fluorine-based solvent.

3. A method for manufacturing a pellicle characterized by using a film-like graphene which is manufactured through steps including: (i) preparing a film-like graphene provided on a base material; (ii) coating said graphene with a protective film; (iii) removing said base material by wet etching with an etching liquid; (iv) dissolving the protective film using a solvent whose surface tension is lower than that of said wet etching liquid.

* * * * *